March 26, 1957 J. C. WALTER 2,786,902

AUTOMATIC GAIN CONTROL CIRCUITS FOR PULSE TYPE RECEIVERS

Filed Sept. 11, 1952

INVENTOR.
JACK C. WALTER

BY George H. Fisher

ATTORNEY

United States Patent Office 2,786,902

Patented Mar. 26, 1957

2,786,902

AUTOMATIC GAIN CONTROL CIRCUITS FOR PULSE TYPE RECEIVERS

Jack C. Walter, Minneapolis, Minn., assignor to Minneapolis-Honeywell Regulator Company, Minneapolis, Minn., a corporation of Delaware Application September 11, 1952, Serial No. 309,025

3 Claims. (Cl. 179—171)

Figures 1, 2:
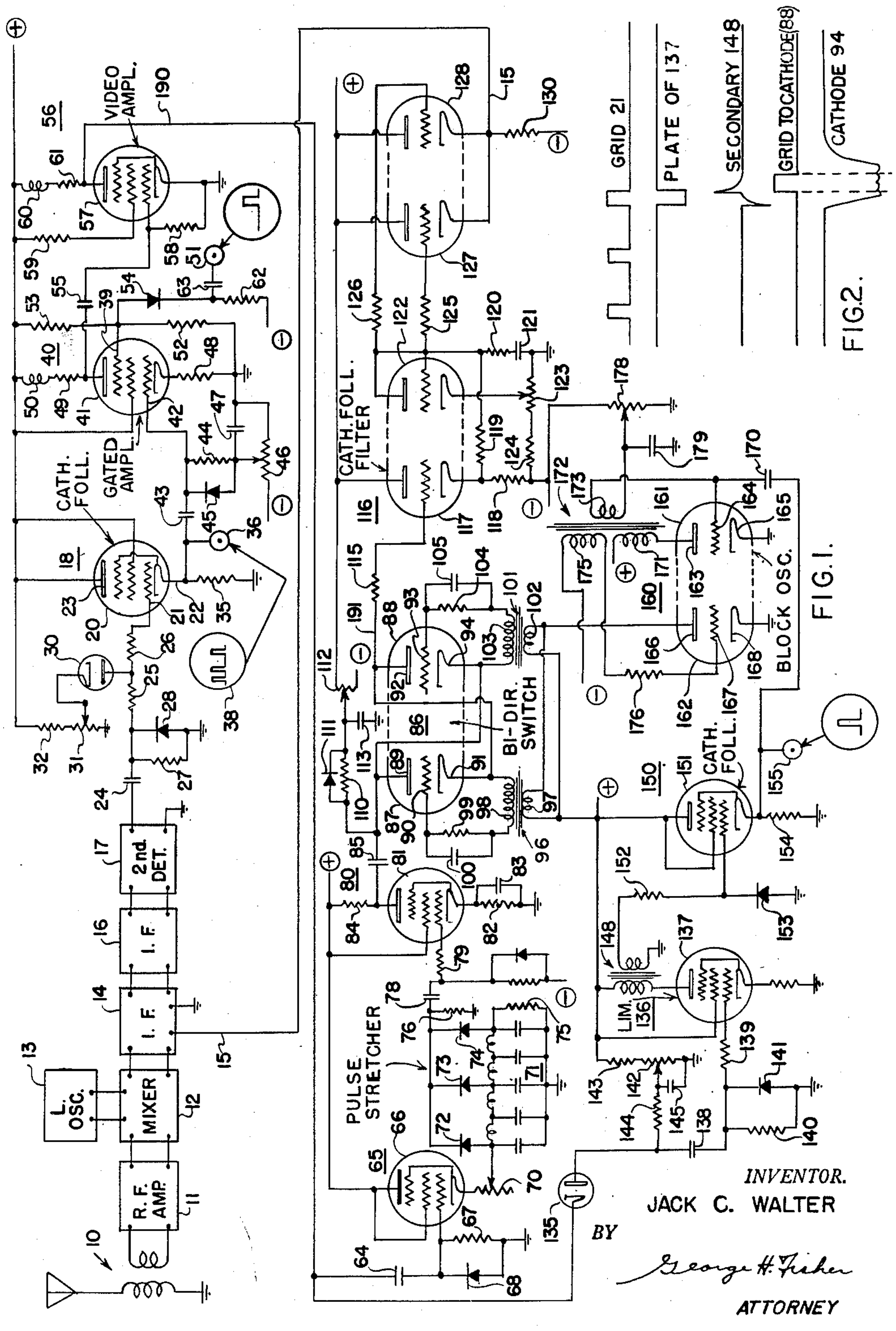

The present invention is concerned with an improved automatic gain control circuit for a pulse type receiver. More particularly, the invention is concerned with an automatic gain control circuit wherein a received pulse of relatively short duration is stretched and a sampling value of this stretched pulse is taken in the center of the stretched pulse.

In automatic gain control circuits for pulse type receivers, it is often desirable to maintain rapid response to changes of amplitude of the incoming control signal or intelligence pulses. This is particularly important in aircraft installations where changes in attitude of the craft cause wide changes in the amplitude of the received signals. It has been found that one way of obtaining fast response in an automatic gain control circuit is to determine the magnitude of each of the received pulses and use that magnitude in determining the biasing voltage in the receiver to maintain the gain of the receiver at a desired value. In order that circuit distortions of the received pulse, particularly its leading and trailing edges, not affect the gain control circuit, the received pulse is stretched and a sampling of the amplitude of the stretched pulse is taken in the central portion thereof. The circuits for producing the sampling or switching pulse for the stretched pulse must be synchronized with the stretched pulse so as to occur at a predetermined time on the stretched pulse. In order to be completely reliable, it is essential that the timing of the sampling pulse be consistent over long periods and not subject to change due to the amplitude changes of the main control pulse.

It is therefore an object of the present invention to provide a new and improved automatic gain control circuit.

A further object of the present invention is to provide a new and improved sampling pulse producing circuit for an automatic gain control circuit in a receiver of the pulse type.

A still further object of the present invention is to provide a circuit for producing a switching pulse at a predetermined time interval after the occurrence of the leading edge of a control pulse.

Another object of the present invention is to provide a switching pulse producing circuit which utilizes the second half wave of a damped blocking oscillator.

Still another object of the present invention is to provide a switching pulse for a stretched wave where that switching pulse is produced by means of a blocking oscillator which is triggered at the time of occurrence of a leading edge of the stretched pulse and the first overshoot half cycle of the blocking oscillator is used as a switching pulse.

These and other objects of the present invention will be understood upon a consideration of the following specification and attached drawing, in which Figure 1 is a schematic showing of a pulse type receiver embodying the invention, and Figure 2 is a set of curves illustrative of the operation of the apparatus.

Referring to the drawing, the numeral 10 represents the antenna input for a high frequency receiver which has an R. F. amplifier stage or stages 11 as the input thereof. The output of the amplifier 11 is fed into a mixer stage 12 wherein the incoming radio frequency signal is mixed with the output of a local oscillator 13. The resultant intermediate frequency is fed through an amplifier section 14 which may contain a plurality of individual amplifying stages. This first intermediate frequency amplifying section 14 has a lead-in conductor or automatic gain control line 15 which supplies an automatic gain control voltage to the stages therein. The output of the section 14 is fed into a further intermediate frequency amplifying section 16 and the latter in turn has its output applied to a second detector 17. The second detector functions in a normal manner to remove the intermediate frequency carrier signal and reduce the signal to an intelligence pulse or a series of pulses. The apparatus described thus far may be of any conventional well known type used in the receiving and amplification of high frequency carrier signals which are modulated by pulses which are of relatively short duration, their duration being in the range of fractions of a microsecond.

In one particular receiver utilizing the present invention, the output of the second detector comprises two coding pulses followed by an intelligence pulse or control pulse. The coding pulses are used for producing a gate for the control pulse, which gate is effective to minimize the effects of noise on the operation of the gain control circuits as well as the receiver output. Details of the noise minimizing and eliminating features shown in the present figure, as well as the gate producing circuits, not shown in the present figure, are shown and claimed in a co-pending application of William A. Adkisson, entitled "Pulse Type Receiver Circuits," Serial No. 309,055, filed September 11, 1952, now Patent No. 2,735,084, and assigned to the assignee of the present application.

Connected to the output of the second detector 17 is a video output stage 18. This video output stage is in the form of a cathode follower and includes a pentode 20 having an input control electrode 21, a cathode 22, and an anode 23. The input to the pentode 20 is through a coupling condenser 24 and a pair of resistors 25 and 26. A clamping circuit in the form of a resistor 27 and a rectifier 28 is used to establish a predetermined base line for the pulses received from the second detector. A diode limiter 30 having its cathode connected to a potentiometer 31 and a resistor 32 acts to limit the amplitude of the signals applied to the control electrode 21. Connected to the cathode 22 of the pentode 20 is a resistor 35 which serves as the output resistor for the stage. Also connected to the cathode 22 is an output jack 36 which will have thereon all of the signals appearing on the output of the second detector. These signals may be in the form shown in the inset 38 and comprise a pair of coding pulses followed by an intelligence pulse or control pulse. The output of the jack 36 may be fed to suitable decoding circuits, shown in the above mentioned Adkisson application, where a gating pulse is produced so as to occur at the same time as the control or intelligence pulse.

The output of the cathode follower is also fed to a gating stage 40. This gating stage comprises a pentode 41 having an input control electrode 42 which is connected to the output of the cathode follower stage 18 by means of a coupling condenser 43. A bias clamping circuit is also connected to the control electrode 42, this clamping circuit comprising a resistor 44, a crystal rectifier 45, and a biasing potentiometer 46 which has one end thereof connected to ground and the other end connected to a negative bus. A by-pass condenser 47 shunts the slider of the potentiometer 46 to ground. A resistor 48 is connected in the cathode circuit of the pentode 41 and a resistor 49 and an inductance 50 are connected in the anode circuit of pentode 41. The magnitude of these components is selected so as to give minimum distortion to the pulses which are to be amplified or passed therethrough. The suppressor grid 39 of the pentode 41 is connected to a voltage divider, between ground and a positive power supply bus, consisting of resistors 52 and 53. The suppressor grid is also connected to a negative power supply bus through rectifier 54 and resistor 62, and is also connected to input jack 51 through rectifier 54 and coupling condenser 63. Fed into the input jack 51 is a suitable gating pulse which is arranged to occur at the same time as the intelligence or control pulse and may be originated by the coding pulses, as mentioned above.

The output of the gating section 40 is fed through a coupling condenser 55 to a video amplifier stage 56. This amplifier stage comprises a pentode 57 which has its control electrode connected to ground by means of a resistor 58 and its screen grid connected to a positive power supply bus through a resistor 59. The anode of the pentode 57 is connected by means of an inductance 60 and resistor 61 to a positive power supply bus.

The output of the video amplifier stage 56 is fed through a coupling condenser 64 to a stage which may be termed a stretcher driver stage 65. The stretcher driver stage comprises a pentode 66 having its control electrode connected to the coupling condenser 64 and also connected to a suitable clamping circuit which includes a resistor 67 and a crystal rectifier 68. A potentiometer 70 is connected to the cathode of pentode 66.

The stretcher driver stage 65 is arranged to supply a driving pulse to an artificial transmission line 71 which comprises a plurality of inductive and capacitive elements connected as an artificial transmission line. The stretcher driver stage 65 and the artificial transmission line 71 are disclosed in a co-pending application of Merle R. Ludwig entitled "Pulse Stretching Apparatus," Serial No. 309,029, now abandoned, filed on even date herewith and assigned to the assignee of the present invention. The pentode 66 is arranged to drive one end of the transmission line 71 and the resultant driving pulse is passed down the transmission line and is picked off at a plurality of points by means of crystal rectifiers 72, 73, and 74. While only three pick-off points have been shown and only four sections of an artificial transmission line, it should be understood that a much greater number of elements may be required in order to stretch the input pulse to the desired length. In one particular adaptation of the present arrangement, eighteen sections were utilized in the transmission line for purposes of stretching the pulse. The output or sampling was taken on every other section of the series. The transmission line 71 is terminated in a resistor 75 which approximates the characteristic impedance of the line 71. A resistor 76 acts as a summation resistor for the pulses picked off by the crystal rectifiers.

The output signal on the resistor 76 is connected through a coupling condenser 78 and a parasitic suppressor resistor 79 to a further amplifying stage 80. This amplifying stage includes a pentode 81 having its cathode grounded through a resistor 82, said resistor being bypassed by condenser 83, and its anode connected to a positive power supply bus by means of a resistor 84.

The coupling condenser 85 connects the output of the amplifying stage 80 to a bi-directional switch stage 86. This bi-directional switch stage comprises a pair of triodes 87 and 88 which may be enclosed in a single envelope. The triode 87 has an anode 89, a control electrode 90, and a cathode 91 while the triode 88 has an anode 92, a control electrode 93, and a cathode 94. Connected between the control electrode 90 and the cathode 91 is a secondary winding 98 of an input transformer 96 in series with a parallel connected resistor 99 and condenser 100. Transformer 96 also has a primary winding 97. Connected between the control electrode 93 and the cathode 94 is a secondary winding 103 of an input transformer 101 in series with a parallel connected resistor 104 and condenser 105. Transformer 101 also has a primary winding 102.

On the input of the bi-directional switching stage 86 is a biased clamping circuit which includes a resistor 110 and a crystal rectifier 111 connected in parallel between anode 89 and a movable tap on a biasing potentiometer 112 which has one end thereof connected to a positive power supply bus and the other end thereof connected to a negative power supply bus. A by-pass condenser 113 connects the movable tap of the potentiometer 112 to ground.

The output of the bi-directional switch 86 is fed through a resistor 115 to a cathode follower filter driver 116. This filter driver comprises a triode 117 having its anode connected to the positive supply bus and its cathode connected to a negative supply bus through a resistor 118. Also connected to the cathode of the triode 117 is a filter section comprising a pair of resistors 119 and 120 and a condenser 121. A triode 122, which may be enclosed in the same envelope as the triode 117, is connected as a diode by having its control electrode connected to its anode. This diode is used to limit the output of the filter section 116 to a predetermined value and is connected across the series connected filter resistor 120 and condenser 121. The value to which the diode will limit the output of filter section 116 is determined by the position of a movable tap on a potentiometer 123 connected in series with a resistor 124 between ground and a negative power supply bus.

The output of the filter section at the upper terminal of the resistor 120 is connected through a pair of resistors 125 and 126 to a pair of parallel connected triode amplifier stages 127 and 128 which may be enclosed in a common envelope. The anodes of the triodes 127 and 128 are connected to a positive power supply bus while the cathodes are connected through resistor 130 to a negative power supply bus. The cathodes are also connected to the automatic gain control line 15 which feeds the gain control voltage back to the intermediate frequency amplifier stage 14.

The output of the video amplifier stage 56 is also fed through a diode 135 to the input of a differentiator amplifier stage 136. This differentiator amplifier stage includes a pentode 137 having its control electrode connected to the diode 135 through a coupling condenser 138 and a parasitic suppressor resistor 139. A clamping circuit in the form of a parallel connected resistor 140 and crystal rectifier 141 is connected between the control electrode input circuit and ground. To establish the level of operation of the diode 135, there is provided a voltage divider consisting of a potentiometer 142 and a resistor 143 connected in series between a positive power supply bus and ground. The slider of potentiometer 142 is connected through a resistor 144 to the anode of the diode 135. A by-pass condenser 145 is connected between the slider of potentiometer 142 and ground. The output of the pentode 137 is fed through a differentiator transformer 148 to a video output stage 150.

The video output stage 150 includes a pentode 151 having a cathode follower output circuit and having its control electrode connected to the secondary winding of the differentiator transformer 148 through a resistor 152. The control electrode of the pentode 151 is also connected to ground through a crystal rectifier 153 which acts as a negative clipper circuit and allows only positive signals to be applied to the input of pentode 151. A cathode output resistor 154 is connected between the cathode of the pentode 151 and ground. A jack 155 may be used to couple the pulse output signal, which appears on the cathode resistor 154, to any desired utilization circuit.

The output of the video output stage 150 is also fed to a centering pulse or switching pulse producing stage 160. This stage includes a pair of triodes 161 and 162 which may be enclosed in a common envelope. Triode 161 has an anode 163, a control electrode 164, and a grounded cathode 165, while the triode 162 has an anode 166, a control electrode 167, and a grounded cathode 168. A coupling condenser 170 connects the output of the viodeo output stage 150 to the control electrode 164 of triode 161. In the output of the triode 161 connected to the anode 163 is a primary winding 171 of a transformer 172. A secondary winding 173 of transformer 172 is regeneratively coupled back to the control electrode 164 of triode 161 while a further secondary winding 175 is coupled through a resistor 176 to the input control electrode 167 of triode 162. The triode 161 is normally biased so as to be non-conductive by a biasing connection including a potentiometer 178 connected between ground and a negative power supply bus whose slider is connected through the transformer secondary winding 173 to the control electrode 164. A by-pass condenser 179 is connected between the slider potentiometer 178 and ground.

*Operation*

In considering the operation of the present apparatus, let it first be assumed that the output of the second detector is a video pulse of relatively short duration, or it may possibly be several video pulses in a series such as two coded pulses followed by an intelligence pulse. These pulses will be fed through the blocking or coupling condenser 24 to the input of the pentode 20. The clamping circuit including the resistor 27 and crystal rectiger 28 will be effective to cause the output pulses to have a base line established by the potential of the lower end of the clamping circuit which in the present situation is ground. Thus, all of the received pulses will appear to be above ground. This arrangement eliminates the effect of an accumulative charge on condenser 24 from signal or noise pulses changing the bias on pentode 18, which would cause a change in the magnitude or amplitude of the received pulses. If the received pulses are no greater than the predetermined value established by the potential on the cathode of the limiting diode 30, the pulses will appear in their received form on the input of the pentode 20.

The output of the pentode 20 will appear upon the cathode resistor 35 and, in the assumed case, will be in the form of two coded pulses followed by an intelligence pulse as shown on the inset 38. This signal is fed through a condenser 43 to the input of pentode 41 of the gating stage 40. The control electrode 42 of pentode 41 is biased so that the pentode 41 is only slightly conductive in the absence of an input signal. However, the pentode 41 is rendered non-conductive at all times, except at the occurrence of a positive gating pulse at input jack 51, due to the negative bias on the suppressor electrode 39. The suppressor electrode 39 is maintained sufficiently negative with respect to ground to prevent conduction in the pentode 41 by means of a voltage divider between ground and the negative power supply bus consisting of resistor 52, rectifier 54, and resistor 62. Upon the occurrence of a positive gating pulse at the input jack 51, the pulse is applied through the condenser 63 to the cathode of rectifier 54 rendering the rectifier 54 non-conductive. This action effectively removes the negative potential and a portion of the above mentioned voltage divider from the suppressor electrode circuit. The suppressor electrode 39 then assumes a potential positive with respect to ground due to the action of a second voltage divider between ground and the positive power supply bus consisting of resistors 52 and 53. Therefore, the pentode 41 is rendered conductive upon the occurrence of a positive gating pulse at the input jack 51, and a signal applied to the control electrode 41 at the time of occurrence of the gating pulse will appear on the output of pentode 41 and be applied through coupling condenser 55 to the input of video amplifying stage 56.

In the event that it is the desire to eliminate the need for the gating pulse on the suppressor grid of the pentode 41, it is possible to adjust the biasing voltage by means of the potentiometer 46 so that the pentode 41 will be conductive when the signal pulses are received from the preceding cathode follower stage 18.

The output of the video amplifier 56 will, if the gating pulse is used, be a single intelligence or control pulse and this pulse will be fed through conductor 190 to the blocking condenser 64 and also to the cathode of diode 135. The pulse after passing through the coupling or blocking condenser 64 will be restored or clamped so that its base line is effectively at ground potential by the action of the rectifier 68 in the resistor 67. This restored pulse is applied to the control electrode of the pentode 66 which acts as a driver for the transmission line 71. The pulse appearing on the control electrode will also appear upon the cathode of pentode 66. Since the transmission line 71 is terminated in a resistance approximating the line's characteristic impedance, the line will appear as a pure resistive load in the cathode circuit of pentode 66, and the wave form of the pulse appearing at the cathode of pentode 66 will not be distorted with respect to the wave form applied to the control electrode of pentode 66. This pulse will be a positive pulse and will immediately cause a current to flow from the tap on potentiometer 70 through the rectifier 72 and resistor 76 to ground. This current flow will produce a voltage drop across the resistor 76 and this voltage drop will remain there as long as current continues to flow in the circuit. The positive pulse appearing upon the tap on potentiometer 70 is passed down the transmission line until the next output terminal or pick-off point is reached. The positive voltage at the next pick-off point will create a further current flow from the transmission line pick-off point through rectifier 73 and resistor 76 to ground. This transmission and pulse producing process will continue on down the length of the transmission line until all of the output terminals have been passed or reached and the resultant output wave on resistor 76 will be a square wave whose amplitude will be determined by the input pulse on the control electrode of the pentode 66 and whose length will be determined by the number of output taps on the transmission line 71 and the effective length of the transmission line with respect to the length of the input pulse. The output wave on resistor 76 is generally referred to as a stretched pulse and this stretched pulse is fed through the coupling condenser 78 to the input of the amplifying stage 80.

The amplifying stage 80 is arranged to feed the stretched pulse in amplified form through a coupling condenser 85 to the bi-directional switch stage 86.

In considering the operation of the bi-directional switch stage, it should first be noted that the anode 89 of the triode 87 is directly connected to the cathode 94 of the triode 88. Likewise, the cathode 91 of triode 87 is connected to the anode 92 of triode 88. It should also be appreciated that upon the output lead wire 191 of the bi-directional switch stage 86 there exists between this wire and ground a certain amount of inter-electrode capacity whose magnitude is around 50 micromicrofarads. Neglecting for the movement the function of the control electrodes of the two triodes, assume a steady state condition of the bi-directional switch. With no pulses being fed into the bi-directional switch stage 86, both the triodes 87 and 88 will be effectively non-conductive. With neither of the triodes conducting the potential of the output conductor 191 will be effectively floating at such a potential as will cause the triode 117 to conduct a current of a relatively high value. With triode 117 conducting at a relatively high value, the potential on the cathode thereof will be more positive than if the tube were less conductive. With this more positive potential on the cathode, a like positive potential is supplied to the control electrodes of triodes 127 and 128 through a circuit that may be traced from the cathode of triode 117 through resistor 119 and resistors 125 and 126 to the respective control electrodes of triodes 127 and 128. With this more positive voltage on the control electrodes of triodes 127 and 128, these triodes will likewise conduct a fairly large current and will cause their cathodes to assume a potential which is closer to that of the positive bus than that of the negative bus. The result is that a more positive voltage will be fed back along the automatic gain control line 15 to the intermediate frequency amplifier stage 14, which in turn allows an increased output from the intermediate frequency stage 14.

Considering now the functioning of the bi-directional switch upon the occurrence of a pulse through the coupling condenser 85, it will be seen that with a negative pulse appearing through the blocking condenser 85 one of the triodes will be rendered conductive and this triode will be triode 88 inasmuch as its cathode 94 is connected to the input coupling condenser 85. When the triode 88 conducts due to the action of this negative pulse, the interelectrode capacity between the conductor 191 and ground will be effectively charged to a new potential and this potential will be more negative than previously. In order to hold this charge the other triode must be rendered nonconductive. This is accomplished by a grid biasing arrangement effective on both triodes only during the time between pulses. This arrangement will be explained later. With a more negative potential on the conductor 191, the triode 117 will be conducting less and therefore its cathode will be less positive than before. This will be reflected to the control electrodes of the triodes 127 and 128, and these triodes will be less conductive so as to cause their cathodes to become more negative and to feed back along the automatic gain control line 15 a more negative biasing signal to the intermediate frequency stage 14, which decreases the output from stage 14.

If the succeeding pulses through the coupling condenser 85 are all of the same magnitude as the first pulse considered, the charge on the inter-electrode capacity on the output conductor 191 will remain substantially the same and there will be no appreciable change in the resultant biasing signal appearing upon the automatic gain control line 15, and the output from intermediate frequency stage 14 will remain essentially the same. However, if the magnitude of the incoming pulse through the coupling condenser 85 is more negative than previously, the triode 88 will conduct to a greater extent than previously and a greater charge will be assumed upon the inter-electrode capacity on conductor 191. This greater charge will increase the biasing voltage on the automatic gain control line 15 to a greater extent than before.

If the magnitude of the incoming pulse through condenser 85 is less, it is desired that the biasing voltage fed back to the intermediate frequency stage 14 is less negative in order to increase the magnitude of the incoming pulse. This less negative voltage would be produced by the action of the bi-directional switch. It will be recalled that the voltage appearing upon the output conductor 191 is negative due to the previous pulses concerned. As the conductor 191 is negative by a predetermined amount, that potential will also appear upon the cathode 91 of the triode 87. With a less negative pulse coming through the coupling condenser 85 and with a predetermined negative potential upon the cathode 91, it will be seen that if the potential of the anode 89 becomes less negative than the potential applied to the cathode 91 there can be conduction through the triode 87. When there is such conduction, there will be a decreasing of the magnitude of the voltage existing on the output conductor 191. If the pulse received immediately following the last discussed condition is even less negative than before, the triode 87 will again conduct and will cause the potential on conductor 191 to be even less negative. With a less negative potential on the conductor 191, there will be a reflection of this condition through the cathode follower stage 116 and triodes 127 and 128 to cause a decrease in the negative biasing voltage applied to the intermediate frequency amplifier section 14 through the automatic gain control line 15, and the magnitude of the incoming pulse will increase.

It will thus be seen that the bi-directional switch 86 in effect follows the incoming pulses from the condenser 85 and re-establishes the potential on the conductor 191 according to the magnitude of each of the received pulses. It will be noted that there is a clamping circuit consisting of resistor 110 and crystal rectifier 111 on the input of this bi-directional switch. This clamping circuit serves to establish a predetermined base line with respect to the incoming pulse, and this particular base line is determined by the setting of the potentiometer 112.

The stretched pulse which is received through the condenser 85 is generally not a perfectly square wave whose amplitude is constant across the entire length thereof. The distortion in this stretched pulse is due to a certain extent to circuit conditions which are difficult to overcome in pulses whose time duration is a fraction of a microsecond. It is therefore desired that a sampling of the stretched pulse occur at a position on the pulse wherein the amplitude is consistent with the actual input amplitude as it is received in the receiver. It is thus desired to apply to the control electrodes 90 and 93 a switching or sampling pulse which will occur at the desired interval in the stretched pulse. The circuit for producing this switching or sampling pulse will be considered next.

It will be recalled that the output from the video amplifier 56 is fed to the cathode of the diode 135. The output pulse from the video amplifier 56 appearing upon the cathode of the diode 135 is a positive pulse. Before the pulse is applied to the diode 135, the diode is conducting in a circuit that may be traced from the positive power supply bus through resistor 143, a portion of potentiometer 142, resistor 144, diode 135, conductor 190, and pentode 57 to ground. As soon as the positive pulse, as applied ot the cathode of diode 135, makes the later positive with respect to the anode of diode 135, the diode will be rendered non-conductive. As a result, the potential on the condenser 138 will increase to a value determined by the setting of the slider of the potentiometer 142. As soon as the diode 135 is again rendered conductive upon the disappearance of the positive pulse on its cathode, the potential of the condenser 138 will go back to its previous value, and as a result there will be produced on the input of the differentiator amplifier stage 136 the positive pulse whose magnitude is limited by the position of the potentiometer 142. The base line of a positive pulse is established at ground potential by means of the clamping circuit including the resistor 140 and rectifier 141. The resultant positive pulse in the input of pentode 137 will cause a surge of current to flow through the differentiating transformer 148 and, due to the phasing of the transformer, there will be applied to the input of the output stage 150 a positive pulse. This positive pulse will appear upon the cathode of the pentode 151 and may be fed out through the jack 155. This positive pulse is also fed over to the switch pulse or sampling pulse producing circuit 160.

The triode 161 is normally maintained non-conductive by reason of the connection of the control electrode 164 to the negative power supply bus through a circuit which may be traced from the control electrode 164 through secondary winding 173 of transformer 172 and potentiometer 178 to the negative bus. The triode 161 will remain non-conductive until a positive innput pulse is received. Likewise, the triode 162 is non-conductive and this is because the control electrode 166 is connected to the negative power supply bus by means of the resistor 176 and the secondary winding 175 of transformer 172.

As soon as a positive pulse is received through the coupling condenser 170 and is applied to the control electrode 164, the triode 161 will start to conduct. The current flow through the triode 161 will cause current to flow through the primary winding 171 of transformer 172. This current flow in the primary winding 171 will cause a voltage to be developed in the secondary windings 173 and 175. The voltage developed in the secondary winding 173 is phased so as to be regenerative and effectively add to the incoming pulse from the coupling condenser 170. This additional regenerative action from the secondary winding 173 will cause a further increase in the current flow through the triode 161 and this condition will build up until such time as the triode 161 becomes saturated. With no further increase in the current flow to the primary winding 171, the field in the transformer 172 will collapse and tend to produce a pulse of opposite polarity on the control electrode 164 so as ot tend to drive the control electrode in the opposite direction from which it was being driven before. The end result is that the triode and the transformer windings 171 and 173 act as a blocking oscillator and the frequency of the oscillations will be determined by the amount of inductance in the windings 171 and 173 as well as the inter-turn and inter-circuit capacity of the arrangement. The blocking oscillator frequency is such that the period of one complete cycle is less than the time length of the stretched pulse which is applied to the bi-directional switch 86.

Due to the circuit constants used in the blocking oscillator circuit, and also due to the bias applied thereto, the oscillator acts as a damped oscillator so that there is only one effective full wave generated by the oscillator. Subsequent oscillations, while possibly present, are generally insignificant and may be disregarded. When the first half cycle of operation of the blocking oscillator is taking place, there is applied to the winding 175 a pulse which is effective to cause the control electrode 167 of triode 162 to be driven further in a negative direction so as to not affect the functioning of the triode 162 which is already biased to be non-conductive. However, as soon as the second half cycle of the first full wave occurs, there is produced in the winding 175, insofar as the control electrode 167 is concerned, a positive pulse and this positive pulse will cause the triode 162 to conduct. This pulse is applied to the parallel connected primary windings 97 and 102 of the transformers 96 and 101 respectively. This pulse is the sample or switch pulse and is effective, when applied through the transformers 96 and 101 to the control electrodes 90 and 93 of the bi-directional switch 86, to cause triodes 87 and 88 to be rendered operative so as to respond to the condition of the stretched pulse when it appears upon the anode 89 and the cathode 94. This sampling pulse causes the control electrodes 90 and 93 to be driven sufficiently positive so that there is a certain amount of grid current flow, and this grid current will be effective to charge the respective grid condensers 100 and 105. The charge on these condensers will maintain the control electrode potential of the triodes 87 and 88 sufficiently negative so that the triodes are non-conducting until the occurrence of a subsequent switching pulse from the triode 162.

It will be seen that the switching pulse will occur in the central portion of the stretched pulse, when it is recalled that the frequency of oscillation of the blocking oscillator is such that its period is less than the time length of the stretched pulse. Thus, the second half wave of the first full wave of the blocking oscillator operation will occur at the same time as the central portion of the stretched wave.

By triggering the blocking oscillator with a leading edge of the pulse which is stretched and applied to the bi-directional switch stage 86 and utilizing the second half wave of the first full wave, it is possible to positively synchronize the sampling or switching pulse with the stretched pulse applied to the bi-directional switch stage 86.

It will thus be seen that as the stretched pulses are applied through the coupling condenser 85 to the bi-directional switch stage 86, the bi-directional switch stage will be ineffective until the switching pulses are received from the triode 162. While the interval during which the triodes 87 and 88 are rendered conductive has been decreased, the operation of the section is substantially as explained above with the potential of the output conductor 191 following the magnitude of each of the received stretched pulses as sampled during the interval that a pulse originates from the triode 162.

The speed of response of the over-all gain control circuit is determined somewhat by the design of the filter which includes resistor 120 and condenser 121 as well as resistor 119. Variations in the magnitudes of these components will change the response rate of the triodes 127 and 128 to changes in potential of the bi-directional switch stage output conductor 191.

From the foregoing it will be seen that there has been provided a new and improved gain control circuit for a pulse type receiver wherein a simple positive acting sampling pulse producing circuit has been provided for rendering operative a bi-directional switch which has a stretched pulse applied thereto. It will be further seen that this has been accomplished by utilizing the overshoot pulse of the second half cycle of the first full wave produced by a blocking oscillator. While many modifications will be obvious to those skilled in the art, it is intended that the scope of the present application be limited solely by the appended claims.

I claim as my invention:

1. Automatic gain control apparatus for a pulse type receiver comprising, in combination: a pulse amplifier including means energizable to adjust the gain thereof; a pulse stretching circuit connected to the output of said amplifier; pulse sampling means capable of activation to give an output potential determined by the amplitude of the stretched pulse; means triggered by said amplifier to activate said sampling means for an interval which is minor compared with the full duration of each stretched pulse and which occurs after the initial rise thereof has been completed and before the final fall thereof has begun; and means connecting the output of said sampling means to said first-named means, whereby to adjust the gain of said amplifier in accordance with the amplitudes of said stretched pulses during said interval only.

2. Automatic gain control apparatus for a pulse type receiver comprising, in combination: a pulse amplifier including means energizable to adjust the gain thereof; a pulse stretching circuit connected to the output of said amplifier; pulse sampling means capable of activation to give an output potential determined by the amplitude of the stretched pulse; means triggered by said amplifier to activate said sampling means for an interval which is minor compared with the full duration of each stretched pulse and which occurs after the initial rise thereof has been completed and before the final fall thereof has begun, said means comprising a damped blocking oscillator producing a pulse whose time length is less than the time length of the stretched pulse; and means connecting the output of said sampling means to said first-named means, whereby to adjust the gain of said amplifier in accordance with the amplitudes of said stretched pulses during said interval only.

3. Automatic gain control apparatus for a pulse type receiver comprising, in combination: a pulse amplifier including bias means energizable to adjust the gain thereof; a pulse stretching circuit connected to the output of said amplifier; pulse sampling means capable of activation to give an output potential determined by the amplitude of the stretched pulse, said sampling means comprising a pair of electron discharge devices forming a bi-directional switch, said devices being normally biased to cut-off; means triggered by the pulse from said amplifier to activate said bi-directional switch for an interval which is minor compared with the full duration of each stretched pulse, and which occurs after the initial rise thereof has been completed and before the final fall thereof has begun, said means comprising a damped blocking oscillator producing a pulse whose time length is less than the time length of the stretched pulse; and circuit means connecting the output of said sampling means to said bias means, whereby to adjust the gain of said amplifier in accordance with the amplitudes of said stretched pulses during said interval only.

References Cited in the file of this patent

UNITED STATES PATENTS

| | | |
|---|---|---|
| 2,108,899 | Peterson | Feb. 22, 1938 |
| 2,118,626 | Smith | May 24, 1938 |
| 2,393,921 | Mason | Jan. 29, 1946 |
| 2,398,490 | Atwood | Apr. 16, 1946 |
| 2,467,486 | Krumhansl et al. | Apr. 19, 1949 |
| 2,516,356 | Tull | July 25, 1950 |
| 2,532,338 | Schlessinger | Dec. 5, 1950 |
| 2,539,465 | Parker | Jan. 30, 1951 |
| 2,632,162 | Hansell | Mar. 17, 1953 |
| 2,677,758 | Robinson | May 4, 1954 |